United States Patent
Matsuoka et al.

(10) Patent No.: US 6,436,586 B1
(45) Date of Patent: Aug. 20, 2002

(54) PELLICLE WITH A FILTER AND METHOD FOR PRODUCTION THEREOF

(75) Inventors: Takashi Matsuoka; Yuichi Hamada; Meguru Kashida, all of Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/544,333

(22) Filed: Apr. 6, 2000

(30) Foreign Application Priority Data

Apr. 21, 1999 (JP) .......................................... 11-114119
Apr. 22, 1999 (JP) .......................................... 11-114580

(51) Int. Cl.$^7$ ................................................ G03F 1/14
(52) U.S. Cl. ........................................... 430/5; 428/14
(58) Field of Search .................................. 428/14; 430/5

(56) References Cited

U.S. PATENT DOCUMENTS 5,492,587 A * 2/1996 Hong ............................. 430/5
5,723,860 A * 3/1998 Hamada et al. ............... 428/14

* cited by examiner

*Primary Examiner*—Alexander S. Thomas
(74) *Attorney, Agent, or Firm*—Oliff & Berridge, PLC

(57) ABSTRACT

There is disclosed a pellicle having a pellicle frame with at least one vent for controlling atmospheric pressure and a filter attached so as to cover the vent, wherein it takes 5 minutes to 180 minutes, to restore a pellicle film swelled during a step of attaching the pellicle to the exposure original plate under atmospheric pressure of 760 mmHg followed by reducing atmospheric pressure to 500 mmHg and keeping the pressure, to the original state and a method for producing it, and a pellicle with a filter having a pellicle frame with at least one vent for controlling atmospheric pressure wherein all over the inner surface of the filter attached so as to cover said vent is impregnated with a resin, and 50% by volume or more of the filter is impregnated therewith. There can be provided a pellicle with a filter having both of impurity-trapping performance and ventilating performance, and a method for producing it, and a pellicle with a filter having ventilating performance wherein impurities can be fixed without being released even under violent airflow such as air blow or the like and finer impurities can be trapped, with keeping ventilating performance.

13 Claims, 2 Drawing Sheets

PELLICLE WITH A FILTER AND METHOD FOR PRODUCTION THEREOF

BACKGROUND OF THE INVENTION

1. Field of the Invention

The present invention relates to a pellicle having a filter for preventing impurities from entering through a vent for controlling atmospheric pressure which is provided on a side surface of a pellicle frame in order to prevent a swelling or a dent of a pellicle film due to change of external atmospheric pressure.

2. Description of the Related Art

In manufacture of semiconductor devices such as LSI, VLSI or the like or devices for a liquid crystal display, an exposure original plate it is used in the present specification as a general term for photo mask, reticle or the like) is placed on a semiconductor wafer such as silicon wafer or an original plate for liquid crystal, and is exposed to light to transfer a pattern with transmitted light. Namely, lithography is performed.

However, if impurities (hereinafter occasionally called trash, dust) are adhered to the exposure original plate in the above-mentioned step, the impurities absorb or bend light, so that a pattern transferred to the semiconductor wafer or the original plate for liquid crystal may be distorted, edge of the pattern may be rough, white portion may be dirtied to be black, resulting in degradation of size, quality, appearance or the like of the pattern. As a result, there are occurred problems of lowering of performance and production yield of a semiconductor device or a device for a liquid crystal display.

In order to avoid the above-mentioned problems, lithography is generally performed in a clean room. However, it is difficult to keep an exposure original plate completely clean even in a clean room. Accordingly, there has been adopted a method of attaching a pellicle that well transmits light for exposure on the surface of the exposure original plate in order to prevent impurities or the like from adhering to the surface of the exposure original plate.

As described above, if a pellicle is attached, impurities are adhered to a pellicle film, not directly to the surface of the exposure original plate. Accordingly, when focusing on a pattern of the exposure original plate during lithography, presence of such impurities do not affect on transfer, and therefore the above-mentioned problems are not caused.

Since the above-mentioned pellicle is provided in order to prevent impurities (trash) from adhering to the exposure original plate, after the pellicle is attached to the exposure original plate, the pellicle is generally closely adhered to the exposure original plate so that impurities outside of the pellicle may not enter the pellicle. Accordingly, there is no ventilation between outside and inside of the pellicle, and thus space formed by the exposure original plate and the pellicle is airtight space.

Although the pellicle is generally used under atmospheric pressure, it is sometimes affected by atmospheric pressure depending on height at which the pellicle is used, season, change in climate. Furthermore, it is sometimes used under decreased pressure.

If atmospheric pressure changes as described above, in the state that the pellicle is attached to the exposure original plate, the pellicle film is swelled or dented, since the space formed by the exposure original plate and the pellicle is airtight space as described above, resulting in change in height of the pellicle film. As a result, for example, the pellicle film is swelled, so that it is brought into contact with a part of an apparatus for exposure. Furthermore, when inspection of impurities on the pellicle film is conducted, for example, focus of a laser for illuminations is shifted, resulting in misdetection. They are severe problems on use.

In these cases, a vent will be effective for controlling atmospheric pressure of inside and outside of the pellicle. However, if a vent is merely provided, impurities will enter with inflow of air through the vent. As a result, original purpose of the pellicle that is preventing impurities from adhering to the surface of the exposure original plate inside of the pellicle cannot be achieved.

From such a point of view, there was proposed a method of controlling atmospheric pressure of inside and outside of the pellicle with preventing impurities from entering, by providing a vent on the side surface of the pellicle frame, and also providing a filter outside of the vent (See Japanese Utility Model publication No. 63-39703).

In such a method of providing a small vent and adhering a filter to the outside thereof, a resin plate or a metal plate wherein a lot of pores having a diameter equivalent to or less than an assumed diameter of impurity is generally used as a filter, in order to prevent impurities having a size causing trouble when conducting lithography from entering.

Meanwhile, the surface and inside of the filter is likely to be damaged, for example, by bending or rubbing or the like, when the filter is adhered to the pellicle frame, resulting in generation of the impurities. Furthermore, impurities which has been existing potentially in the fine pores of the filter since the filter was manufactured are sometimes released to inside of the pellicle due to airflow (ventilation) formed by difference of atmospheric pressure of inside and outside. In order to solve the problem, it is proposed to apply an pressure sensitive adhesive on a part of the filter to control release of the impurities (See Japanese Patent Application Laid-open (KOKAI) No.9-68792, No.9-160223).

However, actually, pattern rule of LSI has been getting finer as sub half micron, and a size of impurity that is allowable to adhere to the pattern surface of the mask has been getting finer. In such a circumstance, more cleanliness is required on use of pellicle. If impurity-trapping performance of a filter is pursued, there has been a problem that ventilating performance of the filter is lowered, so that a sufficient performance in atmospheric pressure controlling function cannot be achieved. On the contrary, if ventilating performance of the filter is pursued, impurity-trapping performance of the filter is relatively lowered, so that there will be caused contradiction that impurity will be allowed to enter the space formed by a pellicle film and an exposure original plate.

Meanwhile, air blow or the like from outside of the filter is sometimes conducted on the purpose of removing impurities. Since airflow passing through the filter by such air blow is far more violent than airflow involved by change in atmospheric pressure, impurities cannot be trapped and fixed sufficiently under conventional condition of treatment with a pressure sensitive adhesive, and impurities are sometimes released into the pellicle.

SUMMARY OF THE INVENTION

The present invention has been accomplished to solve the above-mentioned previous problems. The first object of the present invention is to provide a pellicle with a filter having both of impurity-trapping performance and ventilating performance, and a method for producing it.

The second object of the present invention is to provide a pellicle with a filter having ventilating performance wherein impurities can be fixed without being released even under violent airflow such as air blow or the like and finer impurities can be trapped, with keeping ventilating performance.

In order to achieve the above-mentioned first object, the present invention provides a pellicle having a pellicle frame with at least one vent for controlling atmospheric pressure and a filter that is attached so as to cover the vent, wherein it takes 5 minutes to 180 minutes, to restore the pellicle film swelled during a step of attaching the pellicle to the exposure original plate under atmospheric pressure of 760 mmHg followed by reducing atmospheric pressure to 500 mmHg and keeping the pressure, to the original state.

As described above, if a measurement method and a measurement condition for appreciating ventilating performance of the filter are defined, and a pellicle with a filter is produced so that the results of the measurement fill the condition, namely the condition wherein it takes 5 minutes to 180 minutes, to restore the pellicle film that is swelled, the impurity-trapping performance of the resultant pellicle is significantly improved, so that not only impurities from outside, but also impurities potentially existing inside of the filter due to airflow generated by difference of atmospheric pressure of inside and outside are surely trapped by static electricity formed by friction between airflow and resin or by fine pores, and are hardly released into the pellicle. Furthermore, practical atmospheric pressure controlling function of the pellicle is sufficiently ensured by such ventilating performance. Accordingly, the above pellicle with a filter can have both of ventilating performance and impurity-trapping performance, and is well balanced.

Preferably, the pellicle of the present invention relates to a pellicle wherein a filter is treated with a resin. Preferably, the resin for treating the filter is tacky. In the pellicle with a filter of the present invention, the filter treated with a resin is preferably produced by coating the surface of the filter with a liquid resin and/or by immersing the filter in a liquid resin.

As described above, if the filter is treated with resin, impurity-trapping performance can be improved without lowering the ventilating performance.

In order to achieve the above-mentioned second object, the present invention provides a pellicle with a filter having a pellicle frame with at least one vent for controlling atmospheric pressure wherein all over the inner surface of the filter attached so as to cover said vent is impregnated with a resin, and 50% by volume or more of the filter is impregnated therewith.

As described above, since the filter wherein all over the inner surface of the filter attached so as to cover the vent is impregnated with a resin, and 50% by volume or more of the filter is impregnated with the resin is attached to the vent for controlling atmospheric pressure provided in the pellicle frame, impurities that have been existing potentially in the fine pores since the filter was manufactured can be surely fixed so as not to be released, and are hardly released even with violent air blow. Furthermore, the impurities generated in the filter or entering from the outside are trapped by static electricity generated due to friction between airflow and resin or by fine pores, and hardly enter the pellicle. Furthermore, practical ventilating performance of the filter is sufficiently ensured also by resin impregnation.

In this case, the resin with which the filter is impregnated is preferably tacky.

As described above, if the filter is impregnated with a tacky resin, impurity-trapping performance and fixing performance can be further improved.

In the pellicle with a filter of the present invention, the filter impregnated with the resin is preferably produced by coating the surface of the filter with a liquid resin and/or by immersing the filter in a liquid resin.

As described above, if the filter is impregnated with the resin by coating the surface of the filter with a liquid resin and/or by immersing the filter in a liquid resin, all over the surface of fine pores of the filter can be coated uniformly, so that it is possible to surely fix impurities which have been existing potentially since the filter was produced, and released by strong air blow, or impurities generated when the filter is broken by external pressure, and to trap the impurities entering from the outside surely, in the pellicle with the filter.

The present invention also relates to a method for producing a pellicle with a filter having a pellicle frame in which at least one vent for controlling atmospheric pressure is provided, wherein a filter having a pore size defined so that it takes 5 minutes to 180 minutes to restore the pellicle film swelled during a step of attaching the pellicle to the exposure original plate under atmospheric pressure of 760 mmHg followed by reducing atmospheric pressure to 500 mmHg and keeping the pressure, to the original state, is attached so as to cover said vent.

In order to produce the pellicle with the filter as described above, it is necessary to determine experimentally in detail a relation between a pore size of the filter, a restoring time of the film and impurity-trapping performance (for example, number of impurities increased in the pellicle during ventilating performance test), to select the filter having a pore size corresponding to a restoring time (ventilating performance) and impurity-trapping performance to be required, and to attach it to the pellicle frame so as to cover the vent.

As described above, according to the present invention, there can be provided a pellicle with a filter having both impurity-trapping performance that both of impurities entering from the outside of the filter and impurities generated inside of the filter can be trapped and fixed almost completely and practically sufficient ventilating performance that is atmospheric pressure controlling function.

Furthermore, according to the present invention, in the pellicle having a pellicle frame with at least one vent for controlling atmospheric pressure, it is possible to fix impurities which have been existing potentially since the filter was produced, and thereby prevent them from being released by violent airflow such as air blow or the like, without lowering ventilating performance of the filter provided for preventing impurities from entering through a vent. Even if they become fine impurities and try to enter the pellicle, they can be surely trapped and fixed. Furthermore, there can be formed a filter wherein a swelling of a pellicle film due to change in atmospheric pressure and a restoring speed do not hinder actual use.

Accordingly, if photolithography is conducted using a pellicle with a filter of the present invention, regular transfer pattern can be obtained, so that performance and production yield of a semiconductor device or a device for a liquid crystal display can be improved.

DESCRIPTION OF THE INVENTION AND EMOBDIMENTS

Embodiments of the present invention will now be described. However, the present invention is not limited thereto.

The inventors of the present invention have found that a pellicle with a filter having both of impurity-trapping performance and ventilating performance can be produced by achieving a good balance between ventilating performance and impurity-trapping performance of the filter provided for preventing impurities from entering through a vent to control atmospheric pressure, and have studied a relation between a pore size of a filter, ventilating performance, and impurity-trapping performance.

Furthermore, the inventors of the present invention have found that it is necessary to applying a resin coating to the inner surface of the fine pores of the filter covering a vent, in order to trap and fix fine impurities which have been potentially existing in the fine pores of the filter since the filter was produced, so as not to be released by violent airflow such as air blow or the like, and enter the pellicle as fine impurities, without lowering ventilating performance of the filter provided for preventing impurities from entering through a vent, in a pellicle having a pellicle frame with at least one vent for controlling atmospheric pressure, and have studied condition for treating the filter to complete the present invention.

Figure 1:
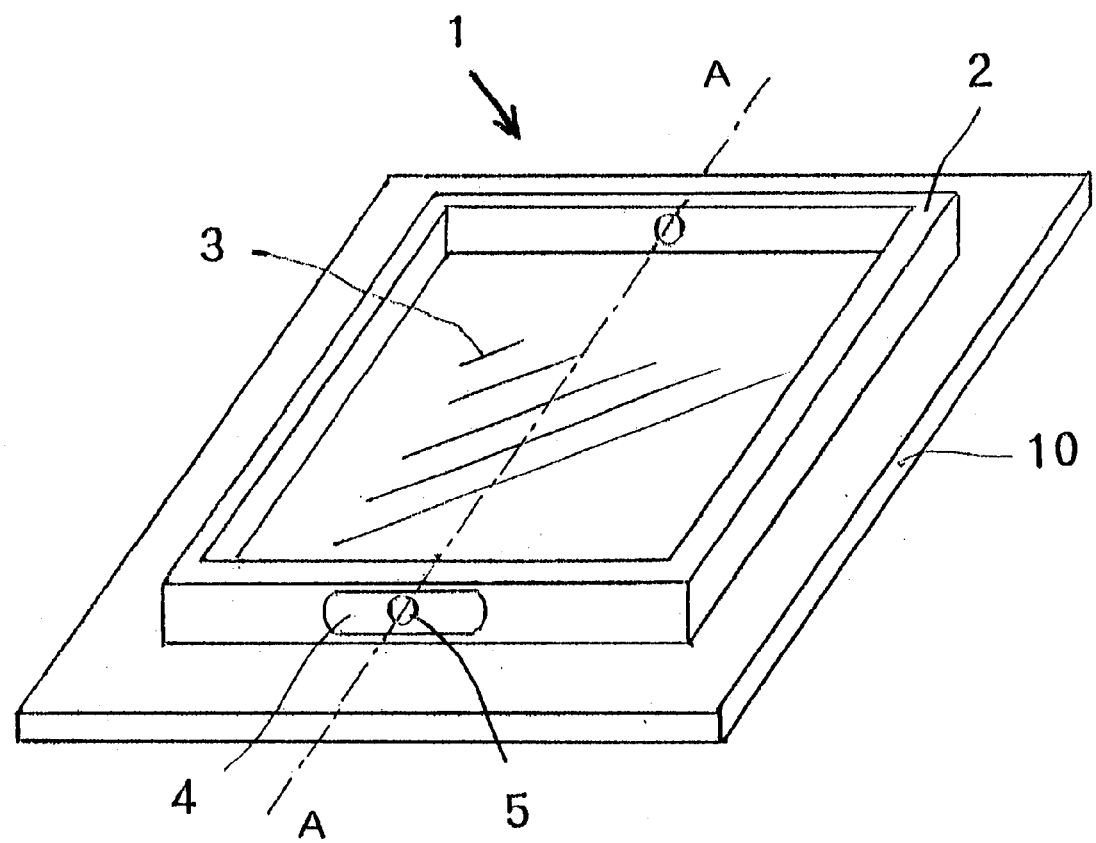
FIG. 1 is a perspective view showing one example of a pellicle with a filter.
Figure 2:
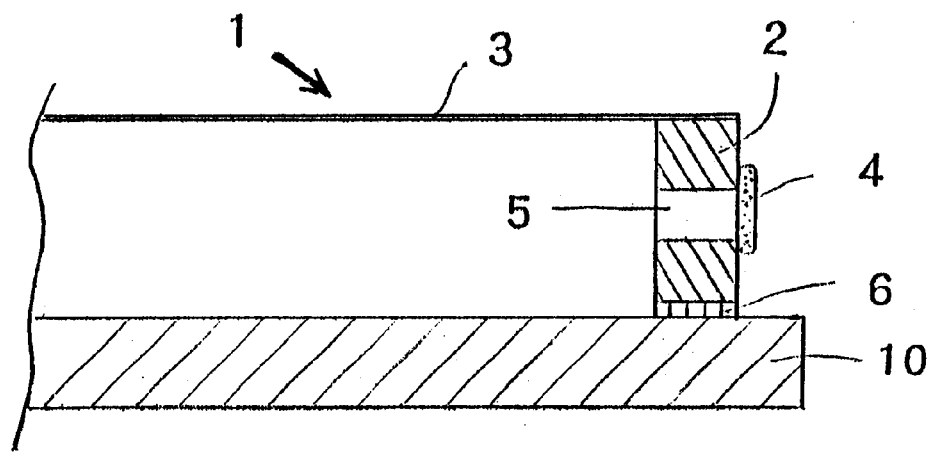
FIG. 2 is A—A line sectional view of FIG. 1.

First, the pellicle with a filter will be explained with referring figures. FIG. 1 is an explanatory schematic view for generally explaining constitution of the pellicle with a filter. FIG. 2 is a sectional view by A—A line sectional view.

The pellicle 1 generally consists of a pellicle frame 2, a pellicle film 3 adhered on the upper edge face of the pellicle frame 2. The pellicle film 3 is generally adhered on the upper edge face of the pellicle frame 2 via an adhesive layer (not shown). A tacky layer 6 for closely adhering the pellicle 1 to a photo mask 10 is formed on the lower edge face of the pellicle frame 2. A liner (not shown) for protecting the tacky layer 6 is stuck on the surface of the tacky layer 6. When lithography is conducted, the liner is pealed off, and a pellicle 1 is put on the photo mask 10 to be adhered closely thereto.

A vent 5 for controlling atmospheric pressure is also provided on the side surface of the pellicle frame 2, and a filter 4 is adhered thereto so as to cover the vent 5 in order to prevent impurities from entering the pellicle through the vent.

In a pellicle with a filter having both of impurity-trapping performance and ventilating performance of the first embodiment of the present invention, there is required a good balance between ventilating performance and impurity-trapping performance of the filter provided for preventing impurities from entering the pellicle through the vent for controlling atmospheric pressure. Accordingly, a relation between ventilating performance and impurity-trapping performance of the filter is experimentally determined for each pore size of the filter and ventilating performance of the filter is defined as follows.

Namely, in the pellicle having a pellicle frame with at least one vent for controlling atmospheric pressure and a filter attached so as to cover the vent of the first embodiment of the present invention, the ventilating performance of the filter is defined so that it may take 5 minutes to 180 minutes, to restore the pellicle film that was swelled when the pellicle was attached to the exposure original plate under atmospheric pressure of 760 mmHg and then atmospheric pressure was reduced to 500 mmHg and the pressure was kept, to the original state.

If the restoring time of the pellicle film is less than 5 minutes, the atmospheric pressure controlling function of the filter and the vent is excellent, but a flow rate of air passing through the vent of the frame gets high, and a pore size of the filter has to be large in order to increase ventilating performance so that impurities may be allowed to enter the pellicle.

On the contrary, if the restoring time of the pellicle film is more than 180 minutes, the pore size of the filter is small, so that impurity-trapping performance is excellent, but the pellicle hardly keeps up with change of external atmospheric pressure.

Accordingly, if the restoring time of the pellicle film is defined in the range of 5 minutes to 180 minutes, and a filter having a pore size corresponding thereto is selected, the pellicle with a filter will be excellent in impurity-trapping performance of the filter, and has practical atmospheric pressure controlling function.

In order to produce such a pellicle with a filter, it is necessary to determine experimentally in detail a relation between a pore size of the filter, a restoring time of the pellicle film and impurity-trapping performance (for example, number of impurities increased in the pellicle during ventilating performance test), as for each material to be used, in advance. Then, a filter having an appropriate pore size is selected, depending on necessary restoring time of the film (ventilating performance) and impurity-trapping performance, and it is adhered so as to cover the vent for controlling atmospheric pressure.

The test for ventilating performance and impurity-trapping performance of the filter is conducted using a pellicle that has been put to practical use. For example, the following measurement condition is set.

The ventilating performance test is conducted as follows: a pellicle to which a sample filter is adhered so as to cover the vent having a diameter of 0.5 mm $\phi$ is adhered to a quartz substrate with a load of 30 kg. Then, the pellicle is set in the vacuum chamber, and the pressure is reduced from ordinary pressure of 760 mmHg to 500 mmHg over 10 seconds. With keeping the pressure, a swelling of the pellicle film is observed, and the time necessary for restoring a swelled pellicle film to the original state is measured.

The above-mentioned ventilating performance test was followed by the impurity-trapping performance test wherein the pellicle was placed in the vacuum chamber again, and the pressure was reduced from ordinary pressure of 760 mmHg to 500 mmHg over 10 seconds. 5 minutes later, the pressure was increased to ordinary pressure over 10 seconds and kept at the pressure for 5 minutes. Such a reducing and increasing pressure cycle is repeated five times. 60 minutes later after the test, when the swelling of the film disappears completely, impurities are checked visually with a condenser lens with illumination of 300,000 lux, and number of the impurities increased on the pellicle during the cycle test are counted.

The performance of the filter is appreciated by the results of the above test. According to the criterion of the present invention, as for ventilating performance, if a restoring time of the film is in the range of 5 minutes to 180 minutes, atmospheric pressure controlling function is considered to be practically sufficient, namely it is accepted. As for impurity-trapping performance, if impurities on the pellicle film are increased in the above cycle test, the filter is considered to be unacceptable.

The material for the filter can be resin such as polytetra fluoroethylene (PTFE) or nylon 66 or the like, metal such as 316L stainless or the like, ceramics such as alumina, aluminum nitride or the like. Anyway, any of porous and permeable material having ventilating performance can be used, and the material is not limited to the specific material.

On the filter is formed a tacky layer for adhering it to cover the vent. The tacky layer is formed by coating a pressure sensitive adhesive in a peripheral part of the inner surface of the filter, namely the surface on the side of the frame when the filter is adhered on the pellicle frame to cover the vent so as not to erode the ventilating area. Examples of material for forming a tacky layer include pressure sensitive adhesive double coated tape, silicone resin pressure sensitive adhesive, acrylic pressure sensitive adhesive or the like.

The filter protecting material is attached on the outer surface of the filter in order to protect the filter from mechanical impact or physical external pressure. As the filter protecting material, porous plastic sheet having appropriate strength, cushioning property and gas permeability is used. As a material, silicone resin, polyethylene, polypropylene, polyurethane or the like can be exemplified.

Then, there will be explained the resin treatment of the filter that can improve impurity-trapping performance without degrading ventilating performance of the filter so much.

Specific treatment method comprises dipping a filter in the liquid resin that is allowed to be liquid by a method such as heating and melting the resin, dissolving the resin in a solvent, or emulsifying the resin in water or the like; or spray coating the surface with the resin liquid to put it in the fine pores and coat inner side of the pores therewith, or the like. However, in the first embodiment of the present invention, the treatment method is not limited thereto, as far as the resin can remain on the filter after the treatment.

In the filter subjected to the above-mentioned treatment, release of impurities potentially existing in the filter can be controlled, and almost no impurities are generated from the filter. Furthermore, if the resin for treatment is a pressure sensitive adhesive, the filter will be excellent also in impurity-trapping performance against impurities entering from the outside. If the resin is used for the treatment in such an amount, the ventilating performance of the filter for practical use is not degraded.

Figure 3:
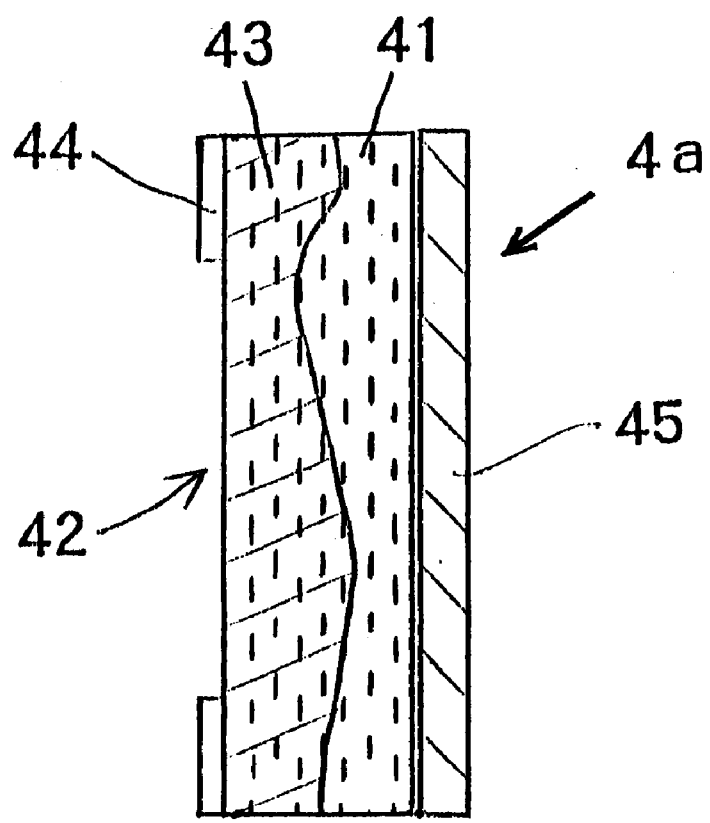
FIG. 3 is a schematic explanatory view showing constitution of the filter of the second embodiment.

Then, the filter of the second embodiment of the present invention will be explained with referring figures. FIG. 3 is an explanatory schematic view for explaining a general constitution of the filter as an example of the present invention.

As shown in FIG. 3, filter 4a of the second embodiment of the present invention consists of a filter body 41, a tacking layer for adhering the filter body 44, and filter protecting material 45.

The filter body 41, the inner surface of the filter 42, namely all over the surface on the side of the frame when the filter is adhered on the pellicle frame to cover the vent, is impregnated with resin so that 50% by volume or more of the filter body 41 may be impregnated with resin, to form resin impregnated layer 43, and then is dried to form resin coating on the inner surface of fine pores of the filter.

Effect of the resin coating will be explained below.

Influence of kinds of resin and impregnating amount of the resin was tested and investigated.

(Test 1-1)

A pellicle frame made of aluminum alloy of which surface is subjected to alumite treatment, having an external dimension of 120 mm×120 mm, height of 6.3 mm and an internal dimension of 110 mm×110 mm, and having a vent of 0.5 mm $\phi$ in the center of one side surface. Silicone pressure sensitive adhesive KR-120 (bland name, manufactured by Shin-Etsu Chemical Corporation) was applied on the lower edge face to form a layer in a shape of tape having a thickness of 0.6 mm, and cured at 120° C. for 30 minutes to form a tacky layer. A pellicle film made of transparent non-crystalline fluorine resin having a thickness of 1.62 $\mu$m was adhered on the upper edge face of the frame with fluorine denatured silicone adhesive.

Then, a filter made of polytetrafluoroethylene (PTFE) having a pore size of 3 $\mu$m and a dimension of 10 mm×3 mm was immersed in a water dispersion of PTFE (solid content: 3%). After confirming that the resin was expanded all over the filter (resin solution impregnation volume: 100%), the filter was subjected to air-dry for 2 hours, and adhered on the above pellicle frame so as to cover the vent of 0.5 mm $\phi$.

The pellicle produced as described above was adhered on a quartz substrate with load of 30 kg. Then, the pellicle was set in the vacuum chamber, and the pressure was reduced from ordinary pressure of 760 mmHg to 500 mmHg over 30 seconds. With keeping the pressure, a swelling of the pellicle film was observed. Although there was a swelling of 6 mm as compared with ordinal state, just after completion of decreasing of pressure, it was deleted 35 minutes later to 0 mm. Accordingly, it was confirmed that there was practically no problem in ventilating performance of the filter.

Then, the pellicle was placed in the vacuum chamber again, and the pressure was reduced from ordinary pressure of 760 mmHg to 500 mmHg over 30 seconds. 5 minutes later, the pressure was increased to ordinary pressure over 30 seconds and kept at the pressure for 5 minutes. Such a reducing and increasing pressure cycle was repeated five times. Impurities adhered on the pellicle film were visually counted with a condenser lens with illumination of 300,000 lux before and after the experiment. There was not observed increase of impurities.

The filter of the pellicle was subjected to air blow of clean air from the point vertically apart 10 mm therefrom, through use of an air gun having an inner diameter of 0.72 mm, with a regulator pressure of 1.0 and 2.5 kgf/cm², for ten seconds. Before and after the air blow, impurities adhered on the pellicle film were visually counted with a condenser lens with illumination of 300,000 lux. There was no increase of impurities.

The results were shown in Table 1.

TABLE 1

| Test No. | Kinds of Impregnation resin | Amount of addition of resin solution (μl) | Volume of filter impregnated with resin solution (%) | Increased number of impurities on the pellicle film after air blow pressure (10 sec) and cycle of reduced and increased pressure (0.3 μm or more) | | | Restoring time for swelling of the pellicle film under reduced pressure (min)** | Evaluation*** |
|---|---|---|---|---|---|---|---|---|
| | | | | 1.0 kg/cm² | 2.5 kg/cm² | reduce* and increase of pressure | | |
| 1-1 | PTFE | Immersion of filter | 100 | 0 | 0 | 0 | 35 | ◉ |
| 1-2 | PTFE | 2.5 | 62 | 0 | 2 | 0 | 25 | ○ |
| 1-3 | PTFE | 1.5 | 40 | 2 | 4 | 3 | 20 | × |
| 2-1 | Pressure sensitive adhesive | immersion of filter | 100 | 0 | 0 | 0 | 35 | ◉ |
| 2-2 | Pressure sensitive adhesive | 3 | 80 | 0 | 0 | 0 | 30 | ◉ |
| 2-3 | Pressure sensitive adhesive | 2.5 | 62 | 0 | 1 | 0 | 25 | ○ |
| 2-4 | Pressure sensitive adhesive | 2 | 50 | 0 | 4 | 0 | 25 | ○ |
| 2-5 | Pressure sensitive adhesive | 1 | 30 | 2 | 4 | 2 | 20 | × |
| 3-1 | none | none | | 0 | 6 | 7 | 2 | 20 | ×× |

*Reducing and increasing pressure cycle (reducing pressure from 760 mmHg to 500 mmHg over 30 seconds, keeping for 5 minutes, increasing pressure to ordinary pressure over 30 seconds, and keeping for 5 minutes), 5 cycles
**Time for restoring a swelling of the pellicle film generated under reduced pressure by increasing pressure
***◉: good, ○: slightly good, ×: no good (Test 1-2, 1-3)

To a filter made of PTFE having a pore size of 3 μm and a dimension of 10 mm×3 mm was added dropwise a water dispersion of PTFE (solid content: 3%) so that the resin may uniformly spread all over the surface from inner surface of the filter, and the filter was attached to the pellicle frame after air dry for 2 hours. Other steps were conducted under similar condition to Test 1-1, to produce a pellicle. Two kinds of sample (1-2, 1-3) were prepared with varying a coating amount of the resin solution.

The ratio by volume of the part of the filter treated with resin solution and results of the measurement of increased number of impurities on the pellicle film after air blow, a period for restoring a swelling of the pellicle film when reducing pressure from ordinary pressure of 760 mmHg to 500 mmHg over 30 seconds were summarized in Table 1.

From results of the Test 1-1 to 1-3 shown in Table 1, it was confirmed that increase of volume of the filter impregnated with resin solution, especially to 50% or more, enables decrease of release of impurities from the filter by air blow and good impurity-trapping performance.

(Test 2-1)

The pellicle was produced under the same condition as Test 1-1 except that a filter made of PTFE having a pore size of 3 μm and a dimension of 10 mm×3 mm was immersed in a solution of 3% silicone pressure sensitive adhesive KR-120 (described above) in toluene, and that after confirming that the pressure sensitive adhesive spread all over the filter, the filter was subjected to air-dry for 20 minutes, and adhered on the pellicle frame.

The ratio by volume of the part of the filter treated with resin solution and results of the measurement of increased number of impurities on the pellicle film after air blow, a period for restoring a swelling of the pellicle film when reducing pressure from ordinary pressure of 760 mmHg to 500 mmHg over 30 seconds were summarized in Table 1.

After conducting the above tests, the filter is removed from the pellicle, and cut. The inner surface and the cutting surface of the filter was analyzed by map analyze of silicon atom according to EPMA (Electron Probe X-ray Micro Analyzer). As a result, silicon dispersion was observed all over the filter volume, and it was confirmed that silicone pressure sensitive adhesive spread all over the surface of the filter.

(Test 2-2 to 2-5, 3-1)

The pellicle was produced under the same condition as Test 1-1 except that to a filter made of PTFE having a pore size of 3 μm and a dimension of 10 mm×3 mm was added dropwise in a solution of 3% silicone pressure sensitive adhesive KR-120 (described above) in toluene so that the resin may uniformly spread all over the surface from inner surface of the filter, and that the filter was subjected to air-dry for 20 minutes and adhered on the pellicle frame. Four kinds of sample (2-2 to 2-5) wherein a coating amount of a resin solution was different each other were prepared.

The ratio by volume of the part of the filter treated with resin solution and results of the measurement of increased number of impurities on the pellicle film after air blow, a period for restoring a swelling of the pellicle film when reducing pressure from ordinary pressure of 760 mmHg to 500 mmHg over 30 seconds were summarized in Table 1.

As test 3-1, a filter that was not impregnated with resin was prepared, the above two kinds of appreciation were conducted. The results were also shown in Table 1.

From the results of the Test 2-1 to 2-5 shown in Table 1, it was confirmed that increase of volume of the filter impregnated with resin solution, especially to 50% or more, enables decrease of release of impurities from the filter by air blow and good impurity-trapping performance. Furthermore, it has been found that, since a pressure sensitive adhesive was used as a resin, impurity-trapping performance was further improved as compared with the resin of Test 1 (PTFE). The period for restoring a swelling of the pellicle film under reduced pressure tends to get longer with increase of volume of the filter impregnated with the resin solution, but it was confirmed that it does not matter practically.

When the filter is impregnated with little or no resin or pressure sensitive adhesive as in the filters of Test 1-3, 2-5, 3-1, impurities were increased by air blow, and it was confirmed that impurity-trapping performance was poor.

From the above-mentioned result, as a pellicle of the second embodiment of the present invention, there was adopted a pellicle with a filter having a pellicle frame with at least one vent for controlling atmospheric pressure, wherein all over the inner surface of the filter attached so as to cover the vent was impregnated with a resin, and 50% by volume or more of the filter was impregnated with the resin.

When the filter has the above-mentioned constitution, since the filter of which all over the inner surface is impregnated with the above resin, and 50% by volume or more of the filter is impregnated therewith is adhered to cover the vent for controlling atmospheric pressure provided to the pellicle frame, impurities which has been potentially existing in the fine pores since the filter was manufactured are surely fixed by the resin and the impurities are hardly released even with a strong air blow. Furthermore, the impurities generated in the filter or entering from the outside can be trapped by static electricity generated by friction between airflow and the resin or by fine pores, and hardly enter the pellicle. Accordingly, ventilating performance of the filter for practical use is sufficiently ensured also by resin impregnation in the amount.

The resin applied in the first and second embodiment of the present invention is preferably the resin having high light resistance against UV light and high adhesion with filter material, and with which the filter body can be easily impregnated, although it is not limited thereto.

Examples of the resin having such properties include: silicone pressure sensitive adhesive, PTFE water dispersion or the like. Especially, tacky resin such as silicone pressure sensitive adhesive is preferably used, since it is more excellent in impurity-trapping performance than general resins.

As described above, if impregnation of the filter with resin is conducted by coating a surface of the filter with liquid resin and/or immersing the filter in liquid resin, all over the surface of the fine pores of the filter can be coated uniformly, so that it is possible to fix surely impurities which have been potentially existing since the filter was produced, and they are prevented from being released by strong air blow. Furthermore, impurities generated when the filter is broken by external pressure can also be surely fixed, and the impurities entering from the outside can be trapped surely.

The material used for the pellicle of the present invention will be explained below.

The material for pellicle film used for the present invention can be material that can well transmit light, for example, preferably nitro cellulose, cellulose acetate, cellulose propionate, denatured polyvinyl alcohol, fluorine polymer or the like, especially fluorine polymer, among them, non-crystalline fluorine polymer such as a copolymer of tetrafluoroethylene and vinylidene fluoride, a terpolymer of tetrafluoro ethylene, hexafluoro propylene and vinilydene fluoride, a copolymer of tetrafluoroethylene and a monomer containing fluorine and having a cyclic perfluoroether group, but is not limited thereto.

Such a non-crystalline fluorine polymer is preferable, since it has a high light transmittance, can be used in wide wave range from short wavelength to long wavelength, and it is excellent in light resistance.

Examples of commercially available non-crystalline fluorine polymer include: Cytop (brand name, manufactured by Asahi glass corporation), Teflon AF (bland name, manufactured by DuPont) or the like. These polymers can be dissolved in solvent to be used, if necessary, in manufacture of pellicle film. For example, they can be dissolved in a fluorine solvent, and applied to a silicon substrate or the like to form a film.

According to the present invention, in order to adhere the above-mentioned pellicle film on the pellicle frame, an adhesive layer is generally provided on the upper edge face of the pellicle frame.

An adhesive used for the adhesive layer is not limited, and can be thermoplastic or thermosetting resin when adhesion is conducted by heating, or can be photosetting resin when adhesion is conducted by photosetting.

Examples of the adhesive include: acrylic resin adhesive, epoxy resin adhesive, silicone resin adhesive, fluorine polymer such as silicone adhesive containing fluorine or the like, among them, fluorine polymer is preferable. Specifically it can be fluorine polymer CT69 (brand name, manufactured by Asahi glass corporation) or the like.

According to the present invention, a tacky layer for attaching the pellicle frame on the exposure original plate and a liner for protecting it can be provided on the lower edge face of the above-mentioned pellicle frame.

Examples of material for the tacky layer include: a pressure sensitive adhesive double coated tape, a silicone resin pressure sensitive adhesive, an acrylic pressure sensitive adhesive or the like.

Examples of material for the liner can be, for example, polyethylene terephthalate (PET), PTFE, phenol—formaldehyde resin (PFA), polyethylene (PE), polycarbonate (PC), vinyl chloride, polypropylene (PP) or the like.

Then, a method for producing such a pellicle with a filter will be explained.

There is prepared a quadrilateral pellicle frame having a vent for controlling atmospheric pressure at the center of the side surface of at least one side of four sides.

The pellicle frame used herein can be in a shape of circle or square. The material therefor is not limited, but can be, for example, metal such as aluminum material subjected to anodic oxidation treatment, stainless steel, or the like, resin such as polyacetal, polycarbonate, methyl polymethacrylate (PMMA), acrylic resin, polyethylene or the like, blue glass, or the like.

In the first embodiment of the present invention, a filter having a pore size adjusted according to the present invention is attached to such a pellicle frame so as to cover a vent provided at the center of the side surface of the frame.

In the second embodiment of the present invention, a filter impregnated with resin of the present invention is attached to such a pellicle frame. In this case, an inner surface of the filter is adhered on the surface of the frame so as to cover the vent provided at the center of the side surface of the frame. Adhesion is conducted by applying an adhesive or a pressure sensitive adhesive on peripheral part of the inner surface of the filter to form an adhesive layer, then placing it so as to cover the vent, and adhering and fixing it.

Then, a pellicle film is put on the pellicle frame to which the filter is attached. The pellicle film can be adhered on the pellicle frame by a conventional method, for example, by a thermal fusion method, a photosetting method or the like, which can be selected depending on characteristics of adhesives.

A tacky layer for adhering the pellicle to a photo mask is formed on the lower edge face of the pellicle frame. A liner for protecting the tacky layer is stuck on the surface of the tacky layer. Thereby, the pellicle with a filter of the present invention is produced.

EXAMPLE

The present invention is explained in detail with referring examples and comparative examples of the present invention, but the present invention is not limited thereto.

Example 1

A pellicle frame made of aluminum alloy of which surface was subjected to alumite treatment, having an external dimension of 120 mm×120 mm, height of 6.3 mm and an internal dimension of the frame of 110 mm×110 mm, wherein a vent of 0.5 mm φ was provided at the center of one side was prepared. Silicone pressure sensitive adhesive KR-120 (bland name, manufactured by Shin-Etsu Chemical Corporation) was applied on the lower edge face to form a layer in a shape of tape having a thickness of 0.6 mm, and cured at 120° C. for 30 minutes to form a tacky layer. A pellicle film made of transparent non-crystalline fluorine resin having a thickness of 1.62 $\mu$m was adhered on the upper edge face of the frame, with fluorine denatured silicone adhesive.

Then, a filter made of polytetrafluoroethylene (PTFE) having a pore size of 3 $\mu$m and a size of 10 mm×3 mm was adhered on the pellicle frame so as to cover a vent of 0.5 mm φ of the above pellicle.

A pellicle manufactured as described above was adhered on a quartz substrate with a load of 30 kg. Then, the pellicle was set in the vacuum chamber, and the pressure was reduced from ordinary pressure of 760 mmHg to 500 mmHg over 10 seconds. With keeping the pressure, a swelling of the pellicle film was observed. Although there was a swelling of 6 mm as compared with original state just after completion of decreasing of pressure, it was deleted 35 minutes later to 0 mm. Accordingly, it was confirmed that there was practically no problem in ventilating property of the filter.

Then, the pellicle was placed in the vacuum chamber, and the pressure was reduced from ordinary pressure of 760 mmHg to 500 mmHg over 10 seconds. 5 minutes later, the pressure is increased to ordinary pressure over 10 seconds and kept at the pressure for 5 minutes. Such a reducing and increasing pressure cycle was repeated five times. 60 minutes later after the test, when the swelling of the film disappeared completely, impurities adhered on the pellicle film were visually counted with a condenser lens with illumination of 300,000 lux. There was not observed increase of impurities in the cycle test. The results of the above-mentioned tests were shown in Table 2.

TABLE 2

| Example No. | Pore size of filter ($\mu$m) | Restoring time for a swelling of the pellicle film under reduced pressure (min)* | Increased number of impurities on the pellicle film after 5 cycles of reducing and increasing pressure cycle (3 $\mu$m or more)** | Evaluation※ |
|---|---|---|---|---|
| Example 1 | 3 | 35 | 0 | ○ |
| Comparative Example 1 | 10 | 3 | 5 | x |
| Comparative Example 2 | 0.5 | 210 | 0 | x |

*Time for restoring a swelling of the pellicle film generated under reduced pressure to the original state by increasing pressure
**Reducing and increasing pressure cycle (reducing pressure from 760 mmHg to 500 mmHg over 10 seconds, keeping for 5 minutes, increasing pressure to ordinary pressure over 10 seconds, and keeping for 5 minutes), 5 cycles
※: ○: good, x: no good Comparative Example 1

A pellicle was produced under the same condition as Example 1 except that a filter made of PTFE with a pore size of 10 $\mu$m and a dimension of 10 mm×3 mm was adhered on the pellicle frame so as to cover the vent, and the same test as Example 1 was conducted. As a result, a restoring time for eliminating a swelling was very short as three minutes, but it was confirmed that the number of impurities having a diameter of 0.3 $\mu$m or more was increased by five on the pellicle film after reducing—increasing pressure cycles, it was confirmed that impurity-trapping performance was inferior. The results were summarized in Table 2.

Comparative Example 2

A pellicle was produced under the same condition as Example 1 except that a filter made of PTFE with a pore size of 0.3 $\mu$m and a dimension of 10 mm×3 mm was adhered on the pellicle frame so as to cover the vent, and the same test as Example 1 was conducted. As a result, the number of impurities was not increased after reducing—increasing pressure cycles, but a restoring time for eliminating a swelling of the pellicle film was very long as 210 minutes, and it was confirmed that the pellicle film does not have sufficient atmospheric pressure controlling function for practical uses. The results were summarized in Table 2.

The present invention is not limited to the above-described embodiment. The above-described embodiment is a mere example, and those having the substantially same structure as that described in the appended claims and providing the similar action and effects are included in the scope of the present invention.

What is claimed is:
1. A pellicle with a filter comprising:
   a pellicle film;
   a pellicle frame with at least one vent for controlling atmospheric pressure; and
   the filter attached so as to cover the at least one vent;
   wherein:
      when the pellicle film swells during a step of attaching the pellicle to an exposure original plate under atmospheric pressure of 760 mmHg, followed by reducing atmospheric pressure to 500 mmHg, the pellicle film is restored to an original state in 5 minutes to 180 minutes, when atmospheric pressure is maintained at 500 mmHg; and the filter is treated with a resin.

2. The pellicle with a filter according to claim 1 wherein said resin for treating the filter is tacky.

3. The pellicle with a filter according to claim 2 wherein said filter treated with a resin is produced by coating the surface of the filter with a liquid resin and by immersing the filter in a liquid resin.

4. The pellicle with a filter according to claim 2 wherein said filter treated with a resin is produced by coating the surface of the filter with a liquid resin or by immersing the filter in a liquid resin.

5. The pellicle with a filter according to claim 1 wherein said filter treated with a resin is produced by coating the surface of the filter with a liquid resin and by immersing the filter in a liquid resin.

6. The pellicle with a filter according to claim 1 wherein said filter treated with a resin is produced by coating the surface of the filter with a liquid resin or by immersing the filter in a liquid resin.

7. A pellicle with a filter having a pellicle frame with at least one vent for controlling atmospheric pressure wherein all over an inner surface of the filter attached so as to cover said vent is impregnated with a resin, and 50% by volume or more of the filter is impregnated therewith.

8. The pellicle with a filter according to claim 7 wherein the resin with which said filter is impregnated is tacky.

9. The pellicle with a filter according to claim 8 wherein the filter impregnated with said resin is produced by coating the surface of the filter with a liquid resin and by immersing the filter in a liquid resin.

10. The pellicle with a filter according to claim 7 wherein the filter impregnated with said resin is produced by coating the surface of the filter with a liquid resin and by immersing the filter in a liquid resin.

11. The pellicle with a filter according to claim 7 wherein the filter impregnated with said resin is produced by coating the surface of the filter with a liquid resin or by immersing the filter in a liquid resin.

12. The pellicle with a filter according to claim 8 wherein the filter impregnated with said resin is produced by coating the surface of the filter with a liquid resin or by immersing the filter in a liquid resin.

13. A method for producing a pellicle with a filter having a pellicle frame in which at least one vent for controlling atmospheric pressure is provided, comprising:

attaching the filter so as to cover said vent, the filter having a pore size such that when the pellicle film swells during a step of attaching the pellicle to an exposure original plate under atmospheric pressure of 760 mmHg, followed by reducing atmospheric pressure to 500 mmHg, the pellicle film is restored to an original state in 5 minutes to 180 minutes, when atmospheric pressure is maintained at 500 mmHg.

* * * * *